(12) United States Patent
Shimeno

(10) Patent No.: US 9,935,596 B2
(45) Date of Patent: Apr. 3, 2018

(54) ANALOG FRONT-END CIRCUIT INCLUDING INSTRUMENTATION PREAMPLIFIER AND A/D CONVERTER

(71) Applicant: NEW JAPAN RADIO CO., LTD., Tokyo (JP)

(72) Inventor: Yoichi Shimeno, Fujimino (JP)

(73) Assignee: NEW JAPAN RADIO CO., LTD., Tokyo (JP)

( * ) Notice: Subject to any disclaimer, the term of this patent is extended or adjusted under 35 U.S.C. 154(b) by 0 days.

(21) Appl. No.: 15/492,947

(22) Filed: Apr. 20, 2017

(65) Prior Publication Data
US 2017/0310289 A1   Oct. 26, 2017

(30) Foreign Application Priority Data
Apr. 21, 2016   (JP) .................................. 2016-085016

(51) Int. Cl.
*H03M 1/06*   (2006.01)
*H03F 3/387*   (2006.01)

(52) U.S. Cl.
CPC ....... *H03F 3/387* (2013.01); *H03F 2200/261* (2013.01); *H03F 2200/375* (2013.01)

(58) Field of Classification Search
CPC .................................................... H03F 3/387
USPC ............................................... 341/118–155
See application file for complete search history.

(56) References Cited

U.S. PATENT DOCUMENTS

| | | | | |
|---|---|---|---|---|
| 5,293,169 A | * | 3/1994 | Baumgartner | H03M 3/488 330/51 |
| 5,382,956 A | * | 1/1995 | Baumgartner | G06F 19/3406 341/126 |
| 5,467,090 A | * | 11/1995 | Baumgartner | A61B 5/0428 341/139 |
| 2014/0167991 A1 | * | 6/2014 | Oshita | H03M 3/458 341/143 |
| 2016/0291631 A1 | * | 10/2016 | Sen | G05F 3/262 |

OTHER PUBLICATIONS

McCarthy, M., Chopping on the AD7190, AD7192, AD7193, AD7194, and AD7195, AN-1131, Application Note, Analog Devices, 2011, 4 pgs. [online] URL: http://www.analog.com/media/en/technical-documentation/application-notes/AN-1131.pdf.

* cited by examiner

*Primary Examiner* — Lam T Mai
(74) *Attorney, Agent, or Firm* — Procopio, Cory, Hargreaves & Savitch LLP

(57) ABSTRACT

One embodiment provides an analog front-end circuit. When a chopping signal has a first logical value, a non-inverting instrumentation preamplifier subtracts a second input voltage from a first input voltage and generates a first output voltage by amplifying a subtraction voltage while outputting the second input voltage as a second output voltage. When the chopping signal has a second logical value, the non-inverting instrumentation preamplifier subtracts the first input voltage from the second input voltage and generates the first output voltage by amplifying and then inverting the polarity of a subtraction voltage while outputting the second input voltage as the second output voltage.

9 Claims, 5 Drawing Sheets

*FIG. 5A*

INPUT/OUTPUT STATES OF
INSTRUMENTATION PREAMPLIFIER 11A IN FIG. 1

| INPUT TERMINALS | | 10-FOLD MAGNIFICATION | OUTPUT TERMINALS | | |
|---|---|---|---|---|---|
| | | | | AD CONVERSION 0 (CHOP = 0) | AD CONVERSION 1 (CHOP = 1) |
| VINP | 2V | ⇒ | VOUTP | 11V | 11V |
| VINN | 1V | | VOUTN | 1V | 1V |

*FIG. 5B*

INPUT/OUTPUT STATES OF
INSTRUMENTATION PREAMPLIFIER 11B IN FIG. 2

| INPUT TERMINALS | | 10-FOLD MAGNIFICATION | OUTPUT TERMINALS | | |
|---|---|---|---|---|---|
| | | | | AD CONVERSION 0 (CHOP = 0) | AD CONVERSION 1 (CHOP = 1) |
| VINP | 2V | ⇒ | VOUTP | 11V | 11V |
| VINN | 1V | | VOUTN | 1V | 1V |

*FIG. 5C*

INPUT/OUTPUT STATES OF
INSTRUMENTATION PREAMPLIFIER 21A IN FIG. 3

| INPUT TERMINALS | | 10-FOLD MAGNIFICATION | OUTPUT TERMINALS | | |
|---|---|---|---|---|---|
| | | | | AD CONVERSION 0 (CHOP = 0) | AD CONVERSION 1 (CHOP = 1) |
| VINP | 2V | ⇒ | VOUTP | 6.5V | −3.5V |
| VINN | 1V | | VOUTN | −3.5V | 6.5V |

*FIG. 5D*

INPUT/OUTPUT STATES OF
INSTRUMENTATION PREAMPLIFIER 21B IN FIG. 4

| INPUT TERMINALS | | 10-FOLD MAGNIFICATION | OUTPUT TERMINALS | | |
|---|---|---|---|---|---|
| | | | | AD CONVERSION 0 (CHOP = 0) | AD CONVERSION 1 (CHOP = 1) |
| VINP | 2V | ⇒ | VOUTP | 11V | −8V |
| VINN | 1V | | VOUTN | 1V | 2V |

ANALOG FRONT-END CIRCUIT INCLUDING INSTRUMENTATION PREAMPLIFIER AND A/D CONVERTER

CROSS-REFERENCE TO RELATED APPLICATION(S)

This application claims priority from Japanese Patent Application No. 2016-085016 filed on Apr. 21, 2016, the entire contents of which are incorporated herein by reference.

FIELD

The present invention relates to an analog front-end circuit including an instrumentation preamplifier and an AD converter and, more particularly, to a technique for reducing an offset component, a temperature drift, low-frequency noise, etc.

BACKGROUND

In analog front-end circuits, a very small analog signal obtained by detecting a temperature, for example, is amplified and AD-converted into data. In this operation, an offset component, a temperature drift, low-frequency noise, etc. (hereinafter referred to as "an offset component etc.") occurring in an instrumentation preamplifier having a high amplification factor and an AD converter have great influences on the performance of the entire circuit.

In view of the above, for example, an analog front-end circuit 20A shown in FIG. 3 is employed which is equipped with a configuration for reducing such offset component etc. (refer to Chopping on the AD7190, AD7192, AD7193, AD7194, and AD7195," Mary McCarthy, AN-1131, APPLICATION NOTE, page 1 of 4, ANALOG DEVICES). The analog front-end circuit 20A is equipped with switches SW11 and SW12 each of which switches between input voltages VINP and VINN that are input from a sensor 1, a differential instrumentation preamplifier 21A which performs differential amplification on the difference between the voltages VINP and VINN that are input via the switches SW11 and SW12, an AD converter 22 for converting the difference between differential output signals VOUTP and VOUTN of the differential instrumentation preamplifier 21A into a digital signal, a switch circuit 23 which passes the output data of the AD converter 22 as it is or after inverting its polarity, and a data calculator 24 for calculating average data of two data that are output from the switch circuit 23 successively.

The differential instrumentation preamplifier 21A is composed of operational amplifiers OP11 and OP12 and gain-setting resistors R11, R12, and R13 (R12=R13), and outputs the voltages VOUTP and VOUTN. The switch circuit 23 is composed of a switch SW13 and a data inverter 23a.

A chopping signal CHOP is a signal that "0" and "1" occur repeatedly and alternately at a prescribed cycle. Each of the switches SW11, SW12, and SW13 selects the input terminals "0" and "1" when the chopping signal CHOP is "0" and "1," respectively.

In FIG. 3, symbols Vos11, Vos12, and Vos13 denote an offset component etc. occurring on the non-inverting input side of the operational amplifier OP11, an offset component etc. occurring on the non-inverting input side of the operational amplifier OP12, and an offset component etc. occurring on the data input side of the AD converter 22, respectively.

In the analog front-end circuit 20A, an output voltage $VO_{CHOP=0}$ of the switch circuit 23 when the chopping signal CHOP is "0" is given by $$VO_{CHOP=0} = (VINP - VINN) \times \left(1 + 2 \times \frac{R12}{R11}\right) + \quad (1)$$

$$(Vos11 - Vos12) \times \left(1 + 2 \times \frac{R12}{R11}\right) + Vos13.$$

On the other hand, an output voltage $VO_{CHOP=1}$ of the switch circuit 23 when the chopping signal CHOP is "1" is given by $$VO_{CHOP=1} = \left\{-(VINP - VINN) \times \left(1 + 2 \times \frac{R12}{R11}\right) + \quad (2)\right.$$

$$(Vos11 - Vos12) \times \left(1 + 2 \times \frac{R12}{R11}\right) + Vos13\right\} \times (-1) =$$

$$(VINP - VINN) \times \left(1 + 2 \times \frac{R12}{R11}\right) -$$

$$(Vos11 - Vos12) \times \left(1 + 2 \times \frac{R12}{R11}\right) - Vos13.$$

Thus, an output OUT of the data calculator 24, that is, the average of two successive output voltages $VO_{CHOP=0}$ and $VO_{CHOP=1}$ of the switch circuit 23, is given by $$OUT = \frac{VO_{CHOP=0} + VO_{CHOP=1}}{2} = (VINP - VINN) \times \left(1 + 2 \times \frac{R12}{R11}\right). \quad (3)$$

In Equation (3), the offset components etc. Vos11, Vos12, and Vos13 are eliminated.

However, in the analog front-end circuit 20A described above with reference to FIG. 3 which employs the differential instrumentation preamplifier 21A, output voltages VOUTP and VOUTN of the differential instrumentation preamplifier 21A vary necessarily in opposite directions (differentially). Thus, where the bias points for input signals VINP and VINN are set at low potentials that are close to GND, the output voltages VOUTP and VOUTN are saturated immediately.

FIG. 5C shows example input voltages VINP and VINN and output voltages VOUTP and VOUTN of the differential instrumentation preamplifier 21A of the analog front-end circuit 20A shown in FIG. 3 in which the input voltages VINP and VINN are 2 V and 1 V, respectively. When the chopping signal CHOP is "0," the input voltages VINP and VINN pass the switches SW11 and SW12 as they are, respectively, and hence the output voltages VOUTP and VOUTN and the amplification factor GAIN are given by $$VOUTP = VINP + \frac{R12}{R11} \times (VINP - VINN) \quad (4)$$

$$VOUTN = VINN + \frac{R12}{R11} \times (VINN - VINP) \quad (5)$$

$$GAIN = \frac{VOUTP - VOUTN}{VINP - VINN} = 1 + 2 \times \frac{R12}{R11} \quad (6)$$

Where the amplification factor GAIN is 10, R12/R11 is calculated to be 4.5 from Equation (6). Thus, the output voltages VOUTP and VOUTN are calculated as $VOUTP=2+4.5\times1=6.5(V)$ $VOUTN=1+4.5\times(-1)=-3.5(V).$ On the other hand, when the chopping signal CHOP is "1," the input voltages VINP and VINN are inverted by the switches SW11 and SW12 and hence the output voltages VOUTP and VOUTN are given by $$VOUTP = VINN + \frac{R12}{R11} \times (VINN - VINP) \quad (7)$$

$$VOUTN = VINP + \frac{R12}{R11} \times (VINP - VINN). \quad (8)$$

Thus, $VOUTP=1+4.5\times(-1)=-3.5(V)$ $VOUTN=2+4.5\times1=6.5(V).$

As described above, in the analog front-end circuit 20A shown in FIG. 3, theoretically, the output voltages VOUTP and VOUTN can become negative. As a result, where a single power source is employed for the operational amplifiers OP11 and OP12, the negative side is saturated to 0 V. Thus, to handle a single-ended signal in which only a signal VINP that is output from the sensor 1 varies on the positive side and a voltage VINN that is output from the sensor 1 is fixed, it is necessary to set high bias points for the voltages VINP and VINN in advance, which results in a problem that the signal range of the output voltage VOUTP is narrowed.

One measure for widening the signal range is an analog front-end circuit 20B shown in FIG. 4 which employs a non-inverting instrumentation preamplifier 21B which uses a single operational amplifier OP11. FIG. 5D shows example input voltages VINP and VINN and output voltages VOUTP and VOUTN of the differential instrumentation preamplifier 21B of the analog front-end circuit 20B shown in FIG. 4.

When the chopping signal CHOP is "0".

$$VOUTP = VINP + \frac{R12}{R11} \times (VINP - VINN) \quad (9)$$

$$VOUTN = VINN \quad (10)$$

$$GAIN = \frac{VOUTP - VOUTN}{VINP - VINN} = 1 + \frac{R12}{R11} \quad (11)$$

Where the amplification factor GAIN is 10, R12/R11 is calculated to be 9 from Equation (11). Thus, the output voltages VOUTP and VOUTN are calculated as $VOUTP=2+9\times1=11(V)$ $VOUTN=1(V).$ On the other hand, when the chopping signal CHOP is "1." the output voltages VOUTP and VOUTN are given by $$VOUTP = VINN + \frac{R12}{R11} \times (VINN - VINP) \quad (12)$$

$$VOUTN = VINP. \quad (13)$$

Thus, $VOUTP=1+9\times(-1)=-8(V)$ $VOUTN=2(V).$

In this case, when the chopping signal CHOP is "0," neither of the output voltages VOUTP and VOUTN is saturated and hence a wide signal range can be obtained. However, when the chopping signal CHOP is "1," the output voltage VOUTP becomes negative, which raises the same problem as in the analog front-end circuit 20A shown in FIG. 3.

One object of the invention is to solve the above problems and thereby provide an analog front-end circuit capable of eliminating offset components etc. by a chopper operation and, in addition, preventing saturation of output voltages of an instrumentation preamplifier in a case of handling a single-ended signal having a wide signal range.

SUMMARY

The invention provides following Aspects 1-5.
1. An analog front-end circuit including:
   an instrumentation preamplifier which receives a first input voltage and a second input voltage and outputs a first output voltage and a second output voltage;
   a switch unit which outputs the first output voltage and the second output voltage of the instrumentation preamplifier by alternately switching them according to a logical transition of a chopping signal;
   an AD converter which converts an analog difference voltage between the first output voltage and the second output voltage that are output from the switch unit into a digital signal; and
   a data calculator which performs an averaging processing on two successive data that are output from the AD converter every time the logic transition of the chopping signal occurs, wherein,
   when the chopping signal has a first logical value, the instrumentation preamplifier performs calculations
   $VOUTP=VINP+G\times(VINP-VINN)$
   $VOUTN=VINN,$ and
   when the chopping signal has a second logical value, the instrumentation preamplifier performs calculations
   $VOUTP=VINP+G\times(VINN-VINP)\times(-1)$
   $VOUTN=VINN,$
   where
   VINP is the first input voltage,
   VINN is the second input voltage,
   VOUTP is the first output voltage,
   VOUTN is the second output voltage, and
   G is a gain of the instrumentation preamplifier.
2. The analog front-end circuit of Aspect 1,
   wherein the instrumentation preamplifier includes:
   a first switch having a second input terminal and a first input terminal which receives the first input voltage;
   a second switch having a first input terminal and a second input terminal which receives the first input voltage;
   a first operational amplifier having a non-inverting input terminal to which an output terminal of the first switch is connected and an inverting input terminal to which an output terminal of the second switch is connected;
   a third switch having a first input terminal to which an output terminal of the first operational amplifier is connected and a second input terminal to which the output terminal of the first operational amplifier is connected via an inversion circuit;

a first resistor having one end which is connected to the second input terminal of the first switch and the first input terminal of the second switch and the other end which receives the second input voltage; and a second resistor connected between an output terminal of the third switch and a connecting point of the second input terminal of the first switch and the first input terminal of the second switch, wherein, when the chopping signal has the first logical value, the first input terminal is selected in each of the first switch, the second switch and the third switch, wherein, when the chopping signal has the second logical value, the second input terminal is selected in each of the first switch, the second switch and the third switch, and wherein the first output voltage is output from the output terminal of the third switch, and the first input voltage is output as the second output voltage.

3. The analog front-end circuit of Aspect 1,
wherein the instrumentation preamplifier includes:
a first switch having a second input terminal and a first input terminal which receives the first input voltage;
a second switch having a first input terminal and a second input terminal which receives the first input voltage;
a first operational amplifier having a non-inverting input terminal to which an output terminal of the first switch is connected and an inverting input terminal to which an output terminal of the second switch is connected;
a third switch having a first input terminal to which an output terminal of the first operational amplifier is connected and a second input terminal to which the output terminal of the first operational amplifier is connected via a first inversion circuit;
a seventh switch having a first input terminal and a second input terminal which receives the second input voltage;
an eighth switch having a second input terminal and a first input terminal which receives the second input voltage;
a second operational amplifier having an inverting input terminal to which an output terminal of the seventh switch is connected and a non-inverting input terminal to which an output terminal of the eighth switch is connected;
a ninth switch having a first input terminal to which an output terminal of the second operational amplifier is connected and a second input terminal to which the output terminal of the second operational amplifier is connected via a second inversion circuit;
a first resistor connected between a connecting point of the second input terminal of the first switch and the first input terminal of the second switch and a connecting point of the first input terminal of the seventh switch and the second input terminal of the eighth switch; and
a second resistor connected between an output terminal of the third switch and a connecting point of the second input terminal of the first switch and the first input terminal of the second switch, wherein an output terminal of the ninth switch is connected to the first input terminal of the seventh switch and the second input terminal of the eighth switch, wherein, when the chopping signal has the first logical value, the first input terminal is selected in each of the first switch, the second switch, the third switch, the seventh switch, the eighth switch and the ninth switch, wherein, when the chopping signal has the second logical value, the second input terminal is selected in each of the first switch, the second switch, the third switch, the seventh switch, the eighth switch and the ninth switch, and wherein the first output voltage is output from the output terminal of the third switch, and the second output voltage is output from the output terminal of the ninth switch.

4. The analog front-end circuit of any one of Aspect 1 to 3, further including:
a sixth switch which is connected between the AD converter and the data calculator, and has a first input terminal to which an output terminal of the AD converter is connected and a second input terminal to which the output terminal of the AD converter is connected via a data inverter, wherein, when the chopping signal has the first logical value, the first input terminal is selected in the sixth switch, wherein, when the chopping signal has the second logical value, the second input terminal is selected in the sixth switch, and wherein the data calculator performs addition processing on data that are received from the sixth switch, as the averaging processing.

5. The analog front-end circuit of any one of Aspect 1 to 3,
wherein the data calculator performs subtraction processing on data that are received from the AD converter, as the averaging processing.

The above-mentioned Aspects 1-5 provide an advantage that offset components etc. can be eliminated by the chopper operation and output voltages of the instrumentation preamplifier are not saturated in a case of handling a single-ended signal having a wide signal range. Furthermore, Aspect 3 provides an advantage of preventing the bias voltage of the AD converter from being affected by the impedance on its input side.

BRIEF DESCRIPTION OF THE DRAWINGS

FIG. 5A is a table showing input/output states of an instrumentation preamplifier of the analog front-end circuit shown in FIG. 1. FIG. 5B is a table showing input/output states of an instrumentation preamplifier of the analog front-end circuit shown in FIG. 2. FIG. 5C is a table showing input/output states of an instrumentation preamplifier of the analog front-end circuit shown in FIG. 3. FIG. 5D is a table showing input/output states of an instrumentation preamplifier of the analog front-end circuit shown in FIG. 4.

DETAILED DESCRIPTION

Embodiment 1

Figure 1:
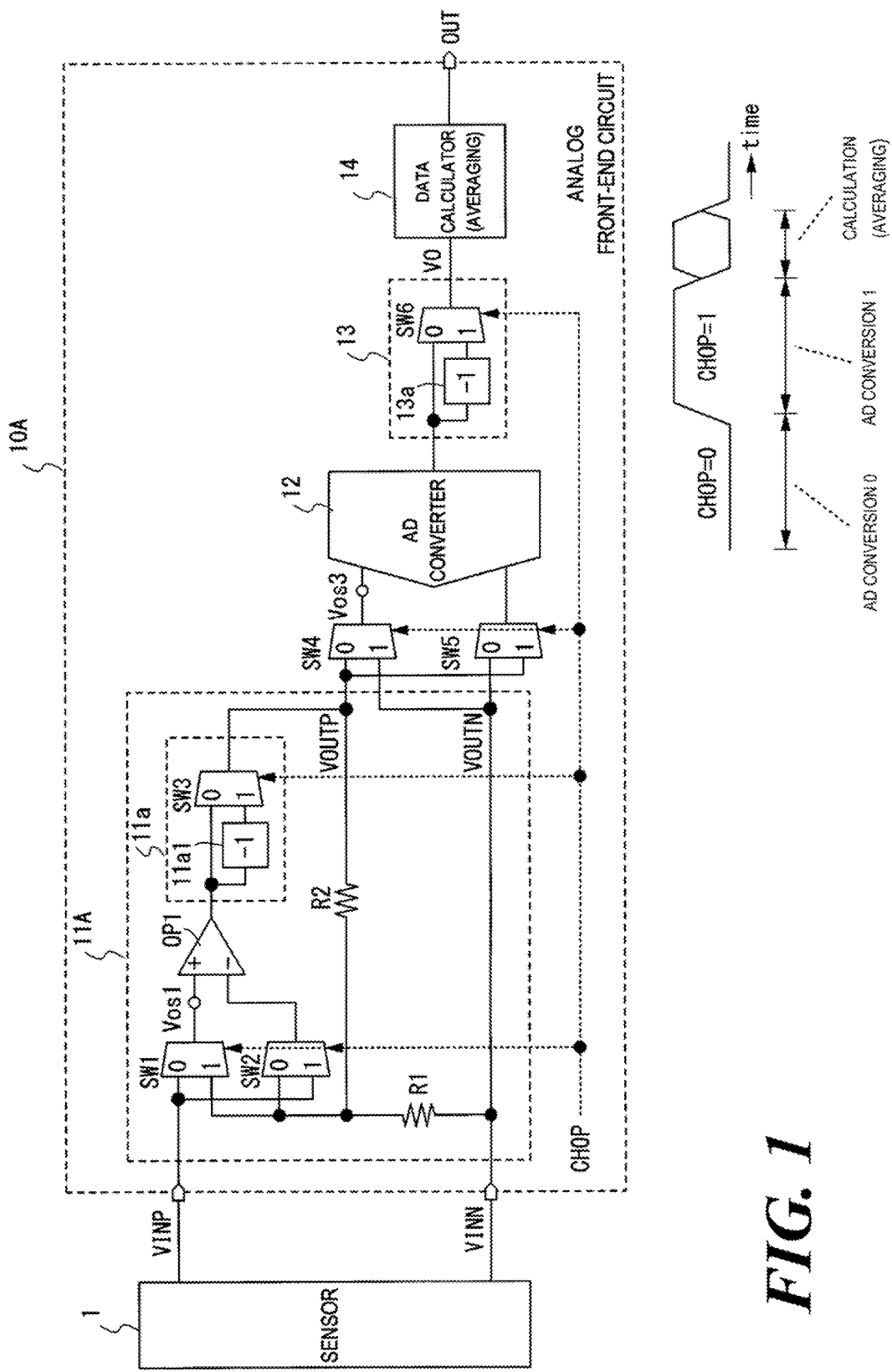
FIG. 1 is a circuit diagram of an analog front-end circuit according to a first embodiment.

FIG. 1 shows an analog front-end circuit 10A according to a first embodiment. The analog front-end circuit 10A is equipped with a non-inverting instrumentation preamplifier 11A which amplifies the difference between input voltages VINP and VINN that are input from a sensor 1 and outputs output voltages VOUTP and VOUTN, switches SW4 and SW5 (switch unit) each of which switches between the output voltages VOUTP and VOUTN, an AD converter 22 (AD converter) for converting the difference between the output voltages VOUTP and VOUTN that are output from the switches SW4 and SW5 into a digital signal, a switch circuit 13 which passes the output data of the AD converter 12 as it is or after inverting its polarity, and a data calculator 14 (data calculator) for calculating average data of two data that are output from the switch circuit 13 successively.

The non-inverting instrumentation preamplifier 11A is composed of switches SW and SW2 each of which switches between input voltages VINP and VINN, an operational amplifier OP1 for amplifying the difference between the input voltages VINP and VINN that have passed the switches SW1 and SW2, gain-setting resistors R1 and R2, and a switch circuit 11a which has an inversion circuit 11a1 and a switch SW3 and passes an output voltage of the operational amplifier OP1 as it is or after inverting its polarity.

The switch circuit 13 has a switch SW6 which passes input data as it is or outputs the input data as polarity-inverted by a data inverter 13a.

A chopping signal CHOP is a signal that "0" and "1" occur repeatedly and alternately at a prescribed cycle. Each of the switches SW1-SW6 selects the input terminals "0" and "1" when the chopping signal CHOP is "0" and "1," respectively.

In FIG. 1, symbols Vos1 and Vos3 denote an offset component etc. occurring on the non-inverting input side of the operational amplifier OP1 and an offset component etc. occurring on the data input side of the AD converter 12, respectively.

In the analog front-end circuit 10A, an output voltage $VO_{CHOP=0}$ of the switch circuit 13 when the chopping signal CHOP is "0" is given by $$VO_{CHOP=0} = (VINP - VINN) \times \left(1 + \frac{R2}{R1}\right) + Vos1 \times \left(1 + \frac{R2}{R1}\right) + Vos3. \quad (14)$$

On the other hand, an output voltage $VO_{CHOP=1}$ of the switch circuit 13 when the chopping signal CHOP is "1" is given by $$VO_{CHOP=1} = \quad (15)$$
$$\left\{-(VINP - VINN) \times \left(1 + \frac{R2}{R1}\right) + Vos1 \times \left(1 + \frac{R2}{R1}\right) + Vos3\right\} \times (-1) =$$
$$(VINP - VINN) \times \left(1 + \frac{R2}{R1}\right) - Vos1 \times \left(1 + \frac{R2}{R1}\right) - Vos3.$$

Thus, an output OUT of the data calculator 14, that is, the average of two successive output voltages $VO_{CHOP=0}$ and $VO_{CHOP=1}$ of the switch circuit 13, is given by $$OUT = \frac{VO_{CHOP=0} + VO_{CHOP=1}}{2} = (VINP - VINN) \times \left(1 + \frac{R2}{R1}\right). \quad (16)$$

In Equation (16), the offset components etc. Vos1 and Vos3 are eliminated.

FIG. 5A shows example input voltages VINP and VINN and output voltages VOUTP and VOUTN of the non-inverting instrumentation preamplifier 11A of the analog front-end circuit 10A shown in FIG. 1 in which the input voltages VINP and VINN are 2 V and 1 V, respectively. When the chopping signal CHOP is "0," the input voltages VINP and VINN pass the switches SW1 and SW2 as they are, respectively, and hence the output voltages VOUTP and VOUTN and the amplification factor GAIN are given by $$VOUTP = VINP + \frac{R2}{R1} \times (VINP - VINN) \quad (17)$$

$$VOUTN = VINN \quad (18)$$

$$GAIN = \frac{VOUTP - VOUTN}{VINP - VINN} = 1 + \frac{R2}{R1}. \quad (19)$$

Where the amplification factor GAIN is 10, R2/R1 is calculated to be 9 from Equation (19). Thus, the output voltages VOUTP and VOUTN are calculated as $VOUTP=2+9\times1=11(V)$ $VOUTN=1(V)$.

On the other hand, when the chopping signal CHOP is "1", the output voltages VOUTP and VOUTN are given by $$VOUTP = VINP + \frac{R2}{R1} \times (VINN - VINP) \times (-1) \quad (20)$$

$$VOUTN = VINN. \quad (21)$$

Thus, $VOUTP=2+9\times(-1)\times(-1)=11(V)$ $VOUTN=1(V)$.

As described above, in the analog front-end circuit 10A shown in FIG. 1, the output voltages VOUTP and VOUTN do not become negative. That is, even if a single-ended signal in which the input voltage VINN is fixed and the input voltage VINP varies, the output voltages VOUTP and VOUTN are not saturated and their signal ranges are widened to a large extent.

Embodiment 2

Figure 2:
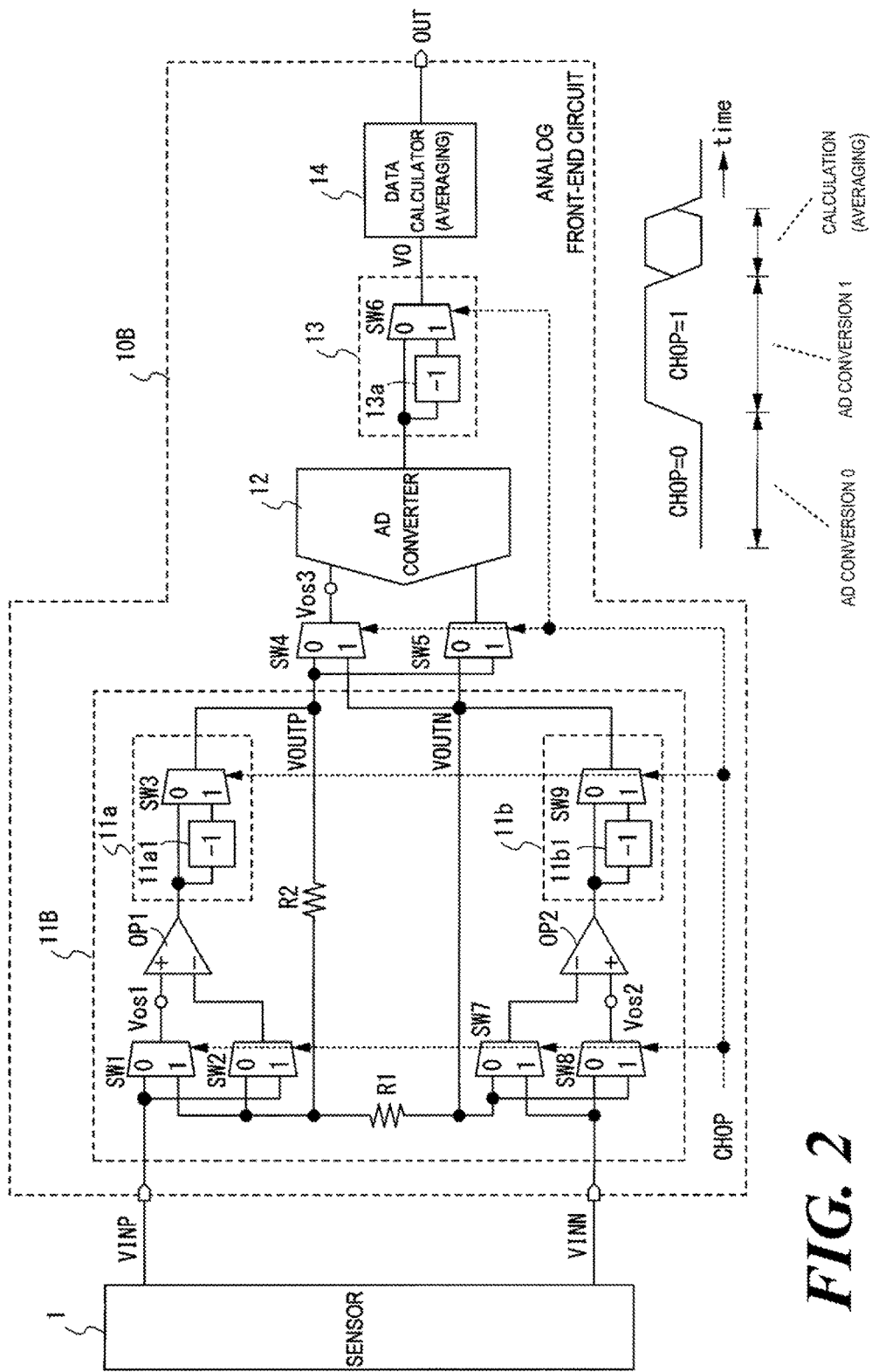
FIG. 2 is a circuit diagram of an analog front-end circuit according to a second embodiment
Figure 3:
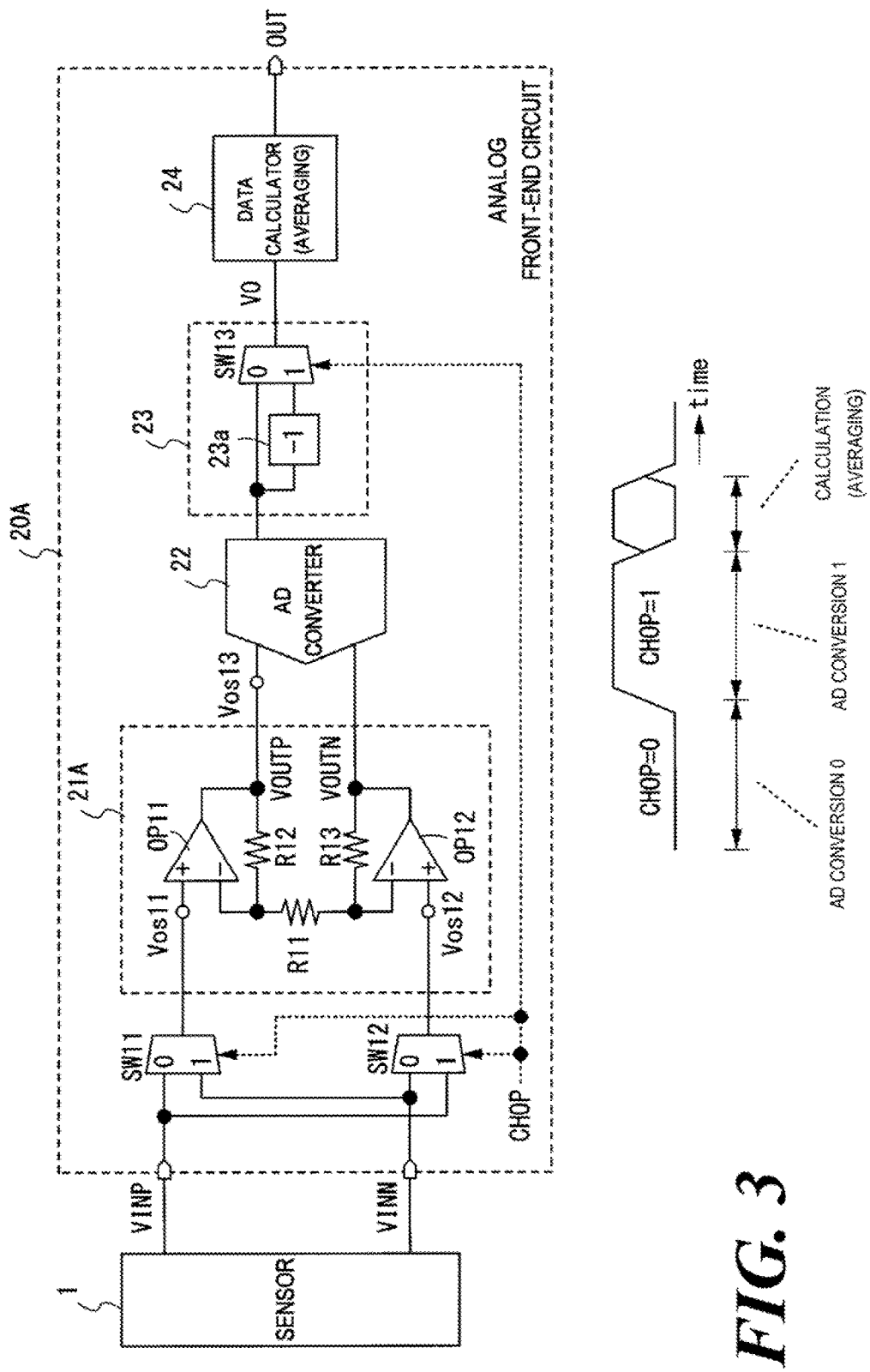
FIG. 3 is a circuit diagram of an analog front-end circuit of a first comparison example.
Figure 4:
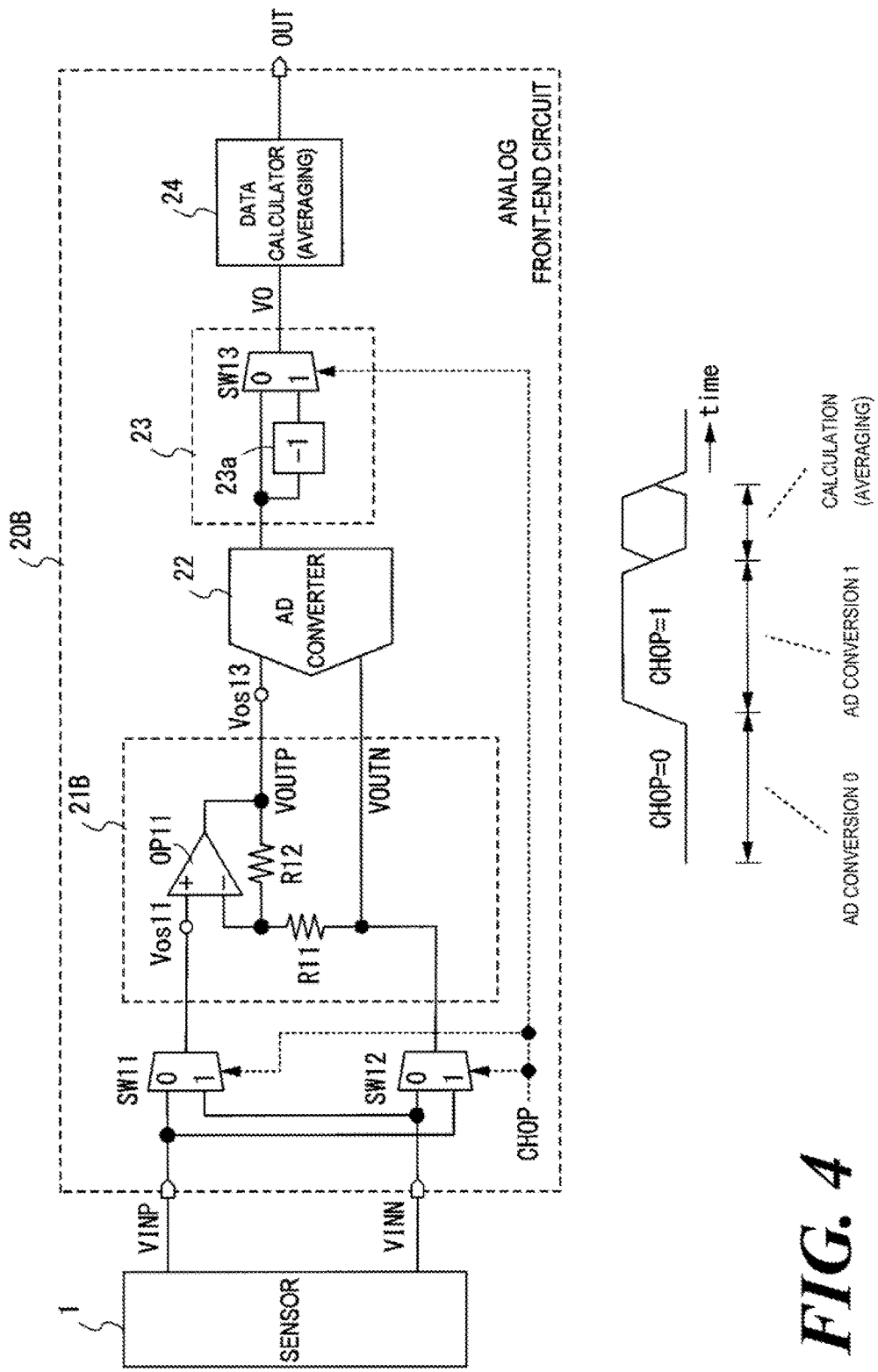
FIG. 4 is a circuit diagram of an analog front-end circuit of a second comparison example.

FIG. 2 shows an analog front-end circuit 10B according to a second embodiment. The analog front-end circuit 10B is different from the analog front-end circuit 10A shown in FIG. 1 in a non-inverting instrumentation preamplifier 11B. The non-inverting instrumentation preamplifier 11B is different from the non-inverting instrumentation preamplifier 11A shown in FIG. 1 in being added with, as a voltage follower circuit, an operational amplifier OP2, switches SW7 and SW8, and a switch circuit 11b which has an inversion circuit 11b1 and a switch SW9 and passes an output voltage of the operational amplifier OP2 as it is or after inverting its polarity.

Each of the switches SW1 and SW2 switches between input voltages for the operational amplifier OP1, and each of the switches SW7 and SW8 switches between input voltages for the operational amplifier OP2.

Each of the switches SW1-SW6 selects the input terminals "0" and "1" when the chopping signal CHOP is "0" and "1," respectively. In FIG. 2, symbols Vos1, Vos2, and Vos3 denote an offset component etc. occurring on the non-inverting input side of the operational amplifier OP1, an offset component etc. occurring on the non-inverting input side of the operational amplifier OP2, and an offset component etc. occurring on the input side of the AD converter 12, respectively.

In the analog front-end circuit 10B, an output voltage $VO_{CHOP=0}$ of the switch circuit 13 when the chopping signal CHOP is "0" is given by $$VO_{CHOP=0} = \quad (22)$$

$$(VINP - VINN) \times \left(1 + \frac{R2}{R1}\right) + (Vos1 - Vos2) \times \left(1 + \frac{R2}{R1}\right) + Vos3.$$

On the other hand, an output voltage $VO_{CHOP=1}$ of the switch circuit 13 when the chopping signal CHOP is "1" is given by $$VO_{CHOP=1} = \quad (23)$$

$$\left\{-(VINP - VINN) \times \left(1 + \frac{R2}{R1}\right) + (Vos1 - Vos2) \times \left(1 + \frac{R2}{R1}\right) + Vos3\right\} \times (-1) =$$

$$(VINP - VINN) \times \left(1 + \frac{R2}{R1}\right) - (Vos1 - Vos2) \times \left(1 + \frac{R2}{R1}\right) - Vos3.$$

Thus, an output OUT of the data calculator 14, that is, the average of two successive output voltages $VO_{CHOP=0}$ and $VO_{CHOP=1}$ of the switch circuit 13, is given by $$OUT = \frac{VO_{CHOP=0} + VO_{CHOP=1}}{2} = (VINP - VINN) \times \left(1 + \frac{R2}{R1}\right). \quad (24)$$

In Equation (24), the offset components etc. Vos1, Vos2 and Vos3 are eliminated.

FIG. 5B shows example input voltages VINP and VINN and output voltages VOUTP and VOUTN of the non-inverting instrumentation preamplifier 11B of the analog front-end circuit 10B shown in FIG. 2. Since the switches SW7 and SW8, the switch circuit 11b, and the operational amplifier OP2 serve as a voltage follower, the input voltages VINP and VINN and the output voltages VOUTP and VOUTN of the non-inverting instrumentation preamplifier 11B are the same as those of the non-inverting instrumentation preamplifier 11B shown in FIG. 1.

In the analog front-end circuit 10B shown in FIG. 2, since the impedance relating to the output voltage VOUTN is isolated from the impedance relating to the input voltage VINN, a phenomenon can be prevented that the bias voltage of the AD converter 12 is affected by the impedance on its input side.

Other Embodiments

In the analog front-end circuits 10A and 10B shown in FIGS. 1 and 2, the data calculator 14 performs averaging processing by adding together two successive output data of the switch circuit 13. The switch circuit 13 can be omitted if the data calculator 14 is configured so as to calculate a difference between two successive input data.

The invention claimed is:

1. An analog front-end circuit including:
an instrumentation preamplifier which receives a first input voltage and a second input voltage and outputs a first output voltage and a second output voltage;
a switch unit which outputs the first output voltage and the second output voltage of the instrumentation preamplifier by alternately switching them according to a logical transition of a chopping signal;
an AD converter which converts an analog difference voltage between the first output voltage and the second output voltage that are output from the switch unit into a digital signal; and
a data calculator which performs an averaging processing on two successive data that are output from the AD converter every time the logic transition of the chopping signal occurs,
wherein the instrumentation preamplifier includes:
a first switch having a second input terminal and a first input terminal which receives the first input voltage;
a second switch having a first input terminal and a second input terminal which receives the first input voltage;
a first operational amplifier having a non-inverting input terminal to which an output terminal of the first switch is connected and an inverting input terminal to which an output terminal of the second switch is connected;
a third switch having a first input terminal to which an output terminal of the first operational amplifier is connected and a second input terminal to which the output terminal of the first operational amplifier is connected via an inversion circuit;
a first resistor having one end which is connected to the second input terminal of the first switch and the first input terminal of the second switch and the other end which receives the second input voltage; and
a second resistor connected between an output terminal of the third switch and a connecting point of the second input terminal of the first switch and the first input terminal of the second switch,
wherein, when the chopping signal has the first logical value, the first input terminal is selected in each of the first switch, the second switch and the third switch,
wherein, when the chopping signal has the second logical value, the second input terminal is selected in each of the first switch, the second switch and the third switch, and
wherein the first output voltage is output from the output terminal of the third switch, and the first input voltage is output as the second output voltage.

2. An analog front-end circuit including:
an instrumentation preamplifier which receives a first input voltage and a second input voltage and outputs a first output voltage and a second output voltage;
a switch unit which outputs the first output voltage and the second output voltage of the instrumentation preamplifier by alternately switching them according to a logical transition of a chopping signal;
an AD converter which converts an analog difference voltage between the first output voltage and the second output voltage that are output from the switch unit into a digital signal; and
a data calculator which performs an averaging processing on two successive data that are output from the AD converter every time the logic transition of the chopping signal occurs,
wherein the instrumentation preamplifier includes:
a first switch having a second input terminal and a first input terminal which receives the first input voltage;
a second switch having a first input terminal and a second input terminal which receives the first input voltage;
a first operational amplifier having a non-inverting input terminal to which an output terminal of the first switch is connected and an inverting input terminal to which an output terminal of the second switch is connected;

a third switch having a first input terminal to which an output terminal of the first operational amplifier is connected and a second input terminal to which the output terminal of the first operational amplifier is connected via a first inversion circuit;

a seventh switch having a first input terminal and a second input terminal which receives the second input voltage;

an eighth switch having a second input terminal and a first input terminal which receives the second input voltage;

a second operational amplifier having an inverting input terminal to which an output terminal of the seventh switch is connected and a non-inverting input terminal to which an output terminal of the eighth switch is connected;

a ninth switch having a first input terminal to which an output terminal of the second operational amplifier is connected and a second input terminal to which the output terminal of the second operational amplifier is connected via a second inversion circuit;

a first resistor connected between a connecting point of the second input terminal of the first switch and the first input terminal of the second switch and a connecting point of the first input terminal of the seventh switch and the second input terminal of the eighth switch; and a second resistor connected between an output terminal of the third switch and a connecting point of the second input terminal of the first switch and the first input terminal of the second switch, wherein an output terminal of the ninth switch is connected to the first input terminal of the seventh switch and the second input terminal of the eighth switch, wherein, when the chopping signal has the first logical value, the first input terminal is selected in each of the first switch, the second switch, the third switch, the seventh switch, the eighth switch and the ninth switch, wherein, when the chopping signal has the second logical value, the second input terminal is selected in each of the first switch, the second switch, the third switch, the seventh switch, the eighth switch and the ninth switch, and wherein the first output voltage is output from the output terminal of the third switch, and the second output voltage is output from the output terminal of the ninth switch.

3. An analog front-end circuit including:

an instrumentation preamplifier which receives a first input voltage and a second input voltage and outputs a first output voltage and a second output voltage;

a switch unit which outputs the first output voltage and the second output voltage of the instrumentation preamplifier by alternately switching them according to a logical transition of a chopping signal;

an AD converter which converts an analog difference voltage between the first output voltage and the second output voltage that are output from the switch unit into a digital signal; and a data calculator which performs an averaging processing on two successive data that are output from the AD converter every time the logic transition of the chopping signal occurs, a sixth switch which is connected between the AD converter and the data calculator, and has a first input terminal to which an output terminal of the AD converter is connected and a second input terminal to which the output terminal of the AD converter is connected via a data inverter, wherein, when the chopping signal has the first logical value, the first input terminal is selected in the sixth switch, wherein, when the chopping signal has the second logical value, the second input terminal is selected in the sixth switch, and wherein the data calculator performs addition processing on data that are received from the sixth switch, as the averaging processing.

4. The analog front-end circuit of claim 1, wherein the data calculator performs subtraction processing on data that are received from the AD converter, as the averaging processing.

5. The analog front-end circuit of claim 1, wherein:

when the chopping signal has a first logical value, the instrumentation preamplifier performs calculations $VOUTP = VINP + G \times (VINP - VINN)$ $VOUTN = VINN$, and when the chopping signal has a second logical value, the instrumentation preamplifier performs calculations $VOUTP = VINP + G \times (VINN - VINP) \times (-1)$ $VOUTN = VINN$, where
VINP is the first input voltage,
VINN is the second input voltage,
VOUTP is the first output voltage,
VOUTN is the second output voltage, and
G is a gain of the instrumentation preamplifier.

6. The analog front-end circuit of claim 2, wherein the data calculator performs subtraction processing on data that are received from the AD converter, as the averaging processing.

7. The analog front-end circuit of claim 2, wherein:

when the chopping signal has a first logical value, the instrumentation preamplifier performs calculations $VOUTP = VINP + G \times (VINP - VINN)$ $VOUTN = VINN$, and when the chopping signal has a second logical value, the instrumentation preamplifier performs calculations $VOUTP = VINP + G \times (VINN - VINP) \times (-1)$ $VOUTN = VINN$, where
VINP is the first input voltage,
VINN is the second input voltage,
VOUTP is the first output voltage,
VOUTN is the second output voltage, and
G is a gain of the instrumentation preamplifier.

8. The analog front-end circuit of claim 3, wherein the data calculator performs subtraction processing on data that are received from the AD converter, as the averaging processing.

9. The analog front-end circuit of claim 3, wherein:

when the chopping signal has a first logical value, the instrumentation preamplifier performs calculations $$VOUTP = VINP + G \times (VINP - VINN)$$

$VOUTN = VINN$, and when the chopping signal has a second logical value, the instrumentation preamplifier performs calculations $$VOUTP = VINP + G \times (VINN - VINP) \times (-1)$$

$VOUTN = VINN$, where
   VINP is the first input voltage,
   VINN is the second input voltage,
   VOUTP is the first output voltage,
   VOUTN is the second output voltage, and
G is a gain of the instrumentation preamplifier.

* * * * *